United States Patent [19]

Goethals et al.

[11] 4,395,768
[45] Jul. 26, 1983

[54] ERROR CORRECTION DEVICE FOR DATA TRANSFER SYSTEM

[75] Inventors: Jean M. E. B. Goethals, Brussels, Belgium; Thijs Krol, Eindhoven, Netherlands

[73] Assignee: U.S. Philips Corporation, New York, N.Y.

[21] Appl. No.: 257,016

[22] Filed: Apr. 24, 1981

Related U.S. Application Data

[63] Continuation of Ser. No. 33,781, Apr. 27, 1979, abandoned.

[30] Foreign Application Priority Data

May 2, 1978 [NL] Netherlands .......................... 7804673

[51] Int. Cl.³ .............................................. G06F 11/10
[52] U.S. Cl. ......................................... 371/45; 371/43
[58] Field of Search ............................. 371/45, 43, 44

[56] References Cited

U.S. PATENT DOCUMENTS

| | | | |
|---|---|---|---|
| 3,387,261 | 6/1968 | Betz | 371/50 |
| 3,447,132 | 5/1969 | Kohlenberg | 371/45 |
| 3,566,352 | 2/1971 | Massey | 371/45 |
| 3,571,795 | 3/1971 | Tong | 371/44 |
| 3,697,947 | 10/1972 | Macy | 371/45 |
| 3,838,393 | 9/1974 | Dao | 371/49 |
| 4,201,976 | 5/1980 | Patel | 371/50 |
| 4,205,324 | 5/1980 | Patel | 371/50 |

Primary Examiner—Charles E. Atkinson
Attorney, Agent, or Firm—James J. Cannon, Jr.

[57] ABSTRACT

An error correction device for digital data storage and transfer systems wherein data are transferred over a plurality of channels. Synchronously with the transfer of a group of data bits, a coding device forms a first correction bit for a first correction channel and a second correction bit for a second correction channel. The first correction bit is formed on the basis of a second group of data bits, the second correction bits being formed on the basis of a third group of data bits. Each data channel supplies the data of two sub-groups of data bits for this purpose. The delay operator having a length of one bit cell being represented by D, a series of directly successive bits can be represented by a polynomial in D: $x0.D^0 + x1.D^1 + x2.D^2 + \ldots$, in which $xj$ ($j = 0, 1 \ldots$) represents the bit value. The quotient of the polynomials relating to the two sub-groups of a data channel is different for each data channel in order to enable correction of an arbitrary error pattern in a single data channel. When the data bits and correction bits are received, a first and a second error elimination bit are calculated from the extracted data bits by using the same algorithm. Comparison of first/second correction-/elimination bit produces two error detection bits. When a given number of successive error detection bits do not indicate a discrepancy, the transfer medium is error-free. When a given configuration of discrepancies is detected, a correction vector is formed which indicates, after storage, the channel containing an error, while further error detection bits indicate the error pattern which can thus be corrected.

8 Claims, 10 Drawing Figures

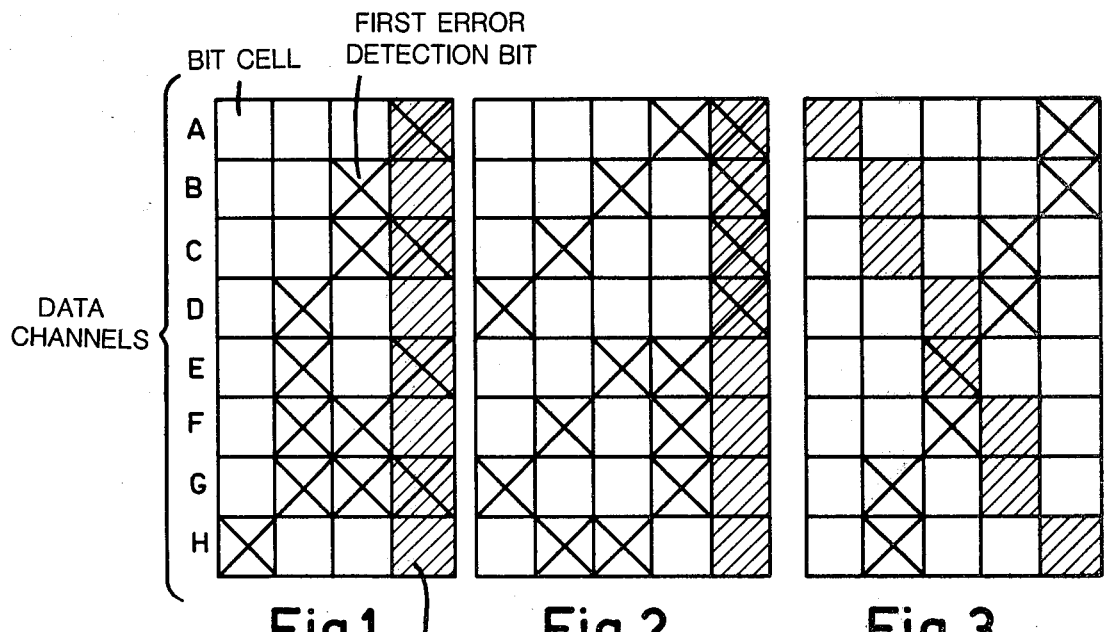

ERROR CORRECTION DEVICE FOR DATA TRANSFER SYSTEM

This is a continuation of application Ser. No. 033,781 filed Apr. 27, 1979 and now abandoned.

BACKGROUND OF THE INVENTION

1. Field of the Invention

The invention relates to a device for introducing binary data into a medium by means of n≧4 parallel available channels of said medium, comprising a coding device having a data input and a number of separate data outputs which are parallel-wise connected to relevant separate inputs of data channels among said n channels of the medium in order to apply, synchronously with the supply of one data to each of said data channels as a first group, at least one error correction bit, formed from a second group of data bits intended for said data channels, to an error correction channel among said channels of the medium. The medium may be a magnetizable material which is driven along a read/write head device. In that case, introduction is to be understood to mean storage. Alternatively, a number of channels for data transmission may be concerned. In that case, introduction is to be understood to mean transmission.

2. Description of the Prior Art

A device of the described kind is known from U.S. Pat. No. 3,697,947. The known technique concerns three data channels and one error correction channel and is based on a convolution code. The formation of the error correction bits is realized by means of EXCLUSIVE-OR logic or modulo-2 addition. An arbitrary error in a group of, for example, three parallel data bits can be corrected by the convolution code used. Obviously, such mutilated three-bit characters must be spaced sufficiently apart. The invention, however, is based on the recognition of the fact that errors are usually limited to a single data channel in which the errors can occur in a closely spaced (but unknown) series. The known code does not offer a solution in this respect. Furthermore, a character-organized error correction would required a large amount of redundancy.

SUMMARY OF THE INVENTION

The invention has for its object to enable correction of an arbitrary error series in a single data channel, while maintaining a number of attractive properties of said technique, for example, the comparatively small amount of redundancy, the instantaneous (on line) generating of the correction bits, and the simplicity of the algorithm used. The invention utilizes the known notation of a group of directly successive data bits $\{x0, x1 \ldots xk\}$ by a polynomial in the delay operator D: $\{x0.D^0 + x1.D + 2.D^2 + \ldots xk.D^k\}$. If given bits are lacking, the associated power of the delay operator D is also lacking. This mathematical description is well-known to those skilled in the art and is published, for example, in the standard work "Error Correcting Codes" by W. W. Peterson and Weldon, MIT Boston, 2nd edition 1971, notably page 393.

The objects in accordance with the invention are realized in that among said n channels said medium comprises n−2 data channels and also two error correction channels for the supply of a first error correction bit formed from said second group of data bits and, together therewith, a second error correction bit formed from a third group of data bits, said second group being composed of a first sub-group of a number of data bits per data channels and said third group being composed of a second sub-group of a number of data bits per data channel in order to enable correction of an arbitrary error series in one of the data channels, for each data channel the quotient of the two polynominals in the delay operator having a length of one bit cell D, in which the relevant first and second sub-groups of the relevant data channel are expressed, being mutually different for all data channel. On the one hand, the amount of redundancy is larger than required in accordance with the known technique, because two redundant channels are present. On the other hand, the amount of redundancy is comparatively small, because it is not dependent on the number of data channels. The errors need not be restricted to a single channel. In given circumstances it may be that an error series first occurs in a first data channel while, after termination thereof, a next error series appears in a second data channel. It is to be noted that the values of the data bits taken into account for a polynominal form the variables of the relevant polynomial, because these values may differ from one bit cell to another. It has been found that a large number of different polynomials, and also many different quotients of polynomials in the delay operator D, can be formed for a limited length of the polynomials. In principle, a polynomial may be identical to zero. However, this is not allowed for both polynomials relating to a single channel, because the quotient of two zero polynomials is mathematically indefinite. In other words, the error correction bits would not at all be affected by an error pattern in such a channel. The input of the coding device may be completely serial, but may alternatively be suitable, for example, for parallel input of a byte or word.

Preferably, each sub-group contains at least one data bit for each data channel. Thus, errors in the two error correction channels can be separately detected, as will be described hereinafter, Preferably, said first sub-groups then contain exactly one data bit for each of the data channels. It has been found that this results in a simple coding device and an equally simple device for correcting errors, if necessary. For such a first sub-group of data bits, the polynomial in the delay operator D can then be simply expressed as $$\{x0\},$$

so that the requirement imposed on the second sub-groups of data bits is reduced to the requirement that for the associated polynomials $$x\{D\} = x0.D^0 + x1.D^1 + x2.D^2 + \ldots$$

differs for all data channels. It is to be noted that the bit x0 is the first of the series, viewed in time, that the number of bits taken into account for the polynomial is finite, and that in principle negative exponents of the delay operator D would also be permissible, even though this cannot be realized physically. An increase of the exponent of D by one unit then implies a delay by one bit cell.

Preferably, the data bits of a second group are introduced together into the medium. This means that the first error correction bit is valid as an error detection bit for a single series of data bits (character) situated transversely of the channels, so that the implementation of the actual error correction is simplified.

Preferably, the first and the second error correction bits are formed by modulo-2 addition of the data bits taken into account. This results in a simple implementation which enables the use of fast logic.

Preferably, said second group contains a single first data bit for each of the data channels, the coefficients of the polynomials in the delay operator D of the second sub-groups which are taken into account for a single second error correction bit among themselves forming a binary code. This offers a large number of possibilities. In other cases other codes may be attractive, for example, an m-out-of-n code or other code.

Preferably, the length of said binary code in bit cells at the most equals the smallest integer number P which at least equals $^2\log(n-1)$. This results in a very compact code with short polynomials. As a result, the circuit is simplified and switching over to another error channel can be realized within a small number of bits.

The invention also relates to a device for extracting and, if necessary, correcting binary data received from a medium in n parallel presented channels, including a first and a second error correction channel. There is provided a recalculation device for calculating time a first and a second error elimination bit from fourth and fifth groups of data bits, respectively, which correspond to said second and third groups, respectively, and also for calculating a first (Q) and a second error detection bit (R), having a correspondence value and a discrepancy value, respectively, from the first error correction bit and the first error elimination bit and from the second error correction bit and the second error elimination bit, respectively. There is provided a storage device for the storage of a correction vector which indicates a channel containing an error, a reset device being provided for generating, under the control of a predetermined number of successive error detection bits having the correspondence value, a reset signal for the storage device in order to store therein a dummy correction vector which does not indicate a channel. There is provided a detection device for detecting a number of predetermined patterns of directly successive error detection bits, at least one of which has the discrepancy value, and for forming a correction vector for a channel containing an error and for storing this vector in the storage device. There also is provided a correction device for indicating, under the control of a correction vector stored in the storage device, a data channel containing an error, and for correcting an error in the indicated channel under the control of the discrepancy value of at least one error detection bit. The device for the formation of the error elimination bits may have a simple construction, while one or more first-arriving error detection bits having the discrepancy value are decoded in order to produce an error vector. When this has taken place the same and/or further error detection bits readily produce a correction pattern which is added, for example, modulo-2 to the error data channel.

Preferably, an output of said detection device is connected to an input of a shift register which is activated for each bit cell in order to store therein, under the control of a first received error detection bit having the discrepancy value, a running 1-out-of-p code, outputs of said shift register being connected to inputs of the storage device in order to apply thereto, under the control of further discrepancy signals, elements of the correction vector up to a maximum length of p binary elements. This results in a simple device. Due to the sequential operation, comparatively little memory capacity is required. Moreover, the number of data channels can often be simply changed. On the other hand, use can also be made of a device based on a read only memory (ROM).

BRIEF DESCRIPTION OF THE DRAWING

The invention will be described in detail hereinafter with reference to the accompanying diagrammatic drawings.

FIG. 1 shows a first coding diagram.
FIG. 2 shows a second coding diagram.
FIG. 3 shows a third coding diagram.
FIG. 4 shows a fourth coding diagram.

DESCRIPTION OF THE PREFERRED EMBODIMENT

Figure 5:
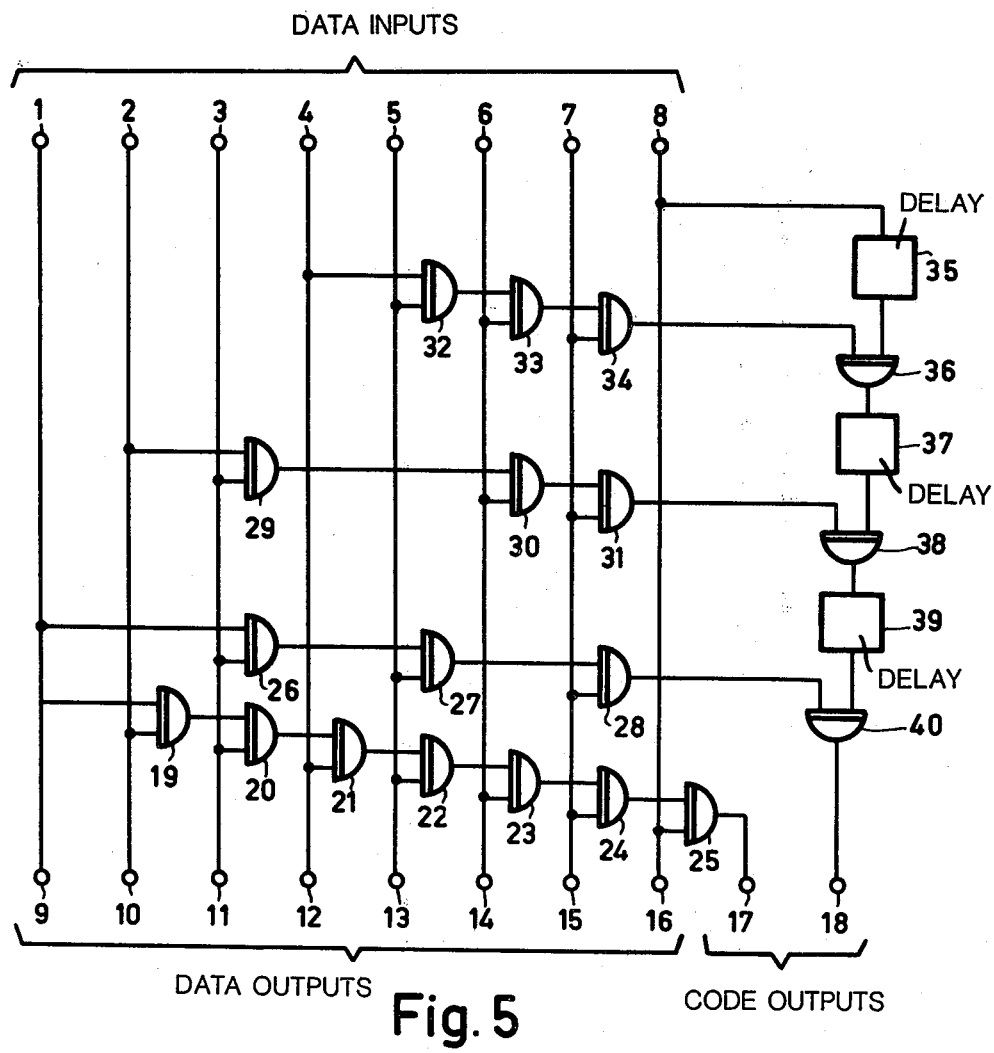
FIG. 5 shows a first coding device relating to FIG. 1.

FIG. 1 shows a first coding diagram. It concerns eight parallel data channels A ... H, this number being arbitrarily chosen. The data bits for the eight data channels are shown in the form of blocks on the successive lines. The extreme left column is first presented to the data channels, subsequently the second column etc. The extreme right column concerns the bits applied to the medium at the instant at which the error correction bits have been calculated and are also presented to the medium. The invention does not relate to the method of implementing the binary data within a bit cell, such as in the NRZ, NRZ1 and similar codes. The first error correction bits are formed by modulo-2 addition of the values of the bits in one and the same column, which are shaded for the first column. In terms of the stated polynomial in the delay operator D (D then corresponds to the length of one bit cell), a first error correction bit may be expressed as:

$$y9(D) = \sum_{i=1}^{ } xi(D)$$

Hereinafter, additions of this kind are always effected in a modulo-2 manner, while $xi(D)$ indicates that the bit value may vary per bit cell. For each column of data bits, one first error correction bit is thus formed which is applied to an error correction channel which is not shown. Similarly, the second error correction bit is formed by modulo-2 addition of the values of the bits in the bit cells denoted by a cross. The contribution of the channel A is thus determined by the (value of the) most recently applied data bit, that of the channel B by the data bit applied in the directly preceding bit cell, that of the channel C by the most recently applied data bit and the data bit presented in the directly preceding bit cell, etc. When the successive second error correction bits are expressed as a polynomial in the delay operator D, they are represented by:

$$y(10)(D) = y(10,0).D^0 + y(10,1).D^1 + y(10,2).D^2 + \ldots$$

Remark: y(10)(D) thus contains the parameter D. The sequence of data bits applied to channel A is represented as:

$$y(1)(D) = x(1,0).D^0 + x(1,1).D^1 + x(1,2).D^2 + \ldots$$

The data bits of the channel B are represented by:

$$x(2)(D) = x(2,0).D^0 + x(2,1).D^1 + x(2,2).D^2 + \ldots$$

etc. for the other data channels. The contribution of the channel A to the succession of second error correction bits is then:

$$x(1)(D) = x(1,0).D^0 + x(1,1).D^1 + \ldots$$

The contribution of the channel B to the succession of second error correction bits each time consists of the data bit applied one bit cell earlier. Thus, for the second error correction bit transmitted in the bit cell 1, this contribution is x(2,0); for the second error correction bit transmitted in the bit cell 2, the contribution is x(2,1), etc. The contribution of the channel B to the succession of second error correction bits y(10)(D) in the form of a polynomial is therefore:

$$x(2,0).D^1 + x(2,1).D^2 + x(2,2).D^3.$$

This may be written as:

$$D^1.x(2)(D).$$

Similarly, the contribution of the channel C to y(10)(D) may be represented as:

$$(D^1 + D^0).x(3)(D).$$

Generally, in this example the contribution of the channel bearing the rank number i to the succession of second error correction bits may be expressed as:

$$g(i)(D).x(i)(D).$$

Therefore, in the example of FIG. 1:

$$g(1)(D) = D^0 \text{(channel A)};$$

$$g(2)(D) = D^1 \text{(channel B)};$$

$$g(3)(D) = D^1 + D^0 \text{(channel C)};$$

$$g(4)(D) = D^2 \text{(channel D)};$$

$$g(5)(D) = D^2 + D^0 \text{(channel E)};$$

$$g(6)(D) = D^2 + D^1 \text{(channel F)};$$

$$g(7)(D) = D^2 D^1 + D^0 \text{(channel G)};$$

$$g(8)(D) = D^3 \text{(channel H)}.$$

The succession of second error correction bits (y(10)(D)) is formed as the modulo-2 sum of the separate contributions of the relevant data channels. Therefore:

$$y(10)(D) = \sum_{i=1} g(i)(D) \cdot x(i)(D)$$

Similarly, the contributions of data channels to the first error correction bit may be expressed as previously.

Where this is expressed for the flow of error correction bits, the same expression is obtained for each individual error correction bit. The ratio (quotient) between the contributions expressed as a polynomial and the relevant error correction bits for each data channel is different for each data channel from the quotient of any other data channel. The data bits and error correction bits are applied to the medium during one bit cell, so that for the second error correction bits the data bits in four successive bit cell times must be taken into account. This requires a certain storage capacity, as will be explained later. In this case, the polynomial in the delay operator for the subgroups taken into account for the first error correction bit is always the same (first sub-groups); for the second sub-groups, the polynomial differs each time, so that the quotient is also different each time. It is not important which of the two polynomials for all channels is chosen as the numerator or denominator of this quotient. The four columns shown in FIG. 1 thus allow for 15 data channels. The sequence of the data channels A to H is arbitrary. The shaded column may also be shifted in its entirety, because this depends only on an additional time delay to be introduced or not. This may mean that in the previously stated polynomial negative exponents of the delay operator D are also used; obviously, a negative delay cannot be directly realized. Furthermore, in FIG. 1 a different choice can be made from the 15 possible combinations of sub-groups for the second error correction bit.

FIG. 2 shows a second coding diagram which is to be considered as a two-out-of-five (generally: m-out-of-n, m<n) code. This has the drawback that longer time sequence patterns are required, and hence also more storage space for the storage of intermediate results and/or data bits, but this is not always objectionable. It is to be noted that the sub-groups in FIG. 1 contain 1–3 data bits, while in FIG. 2 they all contain two data bits. FIG. 3 shows a third coding diagram in which all sub-groups contain only one data bit. The second sub-groups and the third sub-groups again each time produce a pair of polynomials in the delay operator D whose quotient if different, even though the polynomials themselves need not all be different. Thus, it is not necessary to apply all data bits of a said second group to the medium simultaneously.

FIG. 4 shows a further coding diagram wherein at least one polynomial having more than one term for both the first and the second error correction bit is used. The Figure shows the nine different possibilities when only two columns are used. The last two possibilities are preferably not used, because in that case there would be no possibility of detecting an error in the correction channels (obviously, this error need not be corrected). In this case, therefore, all polynomials may be expressed as $(a+bD^1)$, $(a+b\neq O)$ being valid for both correction bits and for each data channel, the + in the latter case indicating an exclusive-OR-function. The remainder of FIG. 4 will be described hereinafter.

FIG. 5 shows a coding device utilizing the coding diagram shown in FIG. 1. The device comprises eight data inputs 1–8, eight data outputs 9–16, two code outputs 17, 18, nineteen exclusive-OR-gates 19–34, 36, 38, 40, and bit delay units 35, 37, 39. The data bits arrive on the lines 1–8 from a data source not shown; these bits are represented by the letters A to H. The data bits are applied in unmodified form to the data outputs which are connected to the medium (not shown). This connection may comprise a variety of adaptations to the medium, such as a suitable impedance matching device, a write head (in the case of a magnetizable medium), a generator for an NRZ-1 code and so on. The bit delay unit 35 receives the data bit H and delays this data by a period of time which corresponds to one bit cell. To this end, the element 35 may be, for example, a known shift register stage which is driven by a clock pulse system (not shown). Similarly, the bit delay units 37, 39 may be driven by this clock pulse system. The outputs 9–18 may also be synchronized in a corresponding manner, so that each time ten bits are presented together to the medium. The gates 32–34 form the logic function $D \oplus E \oplus F \oplus G$ which is added modulo-2, by way of the gate 36, to the data H which appeared one bit cell earlier and which is present on the output of the bit delay element 35; the result of this addition is applied to the bit delay element 37. The gates 29–31 form the function $B \oplus C \oplus F \oplus G$ which is added modulo-2, by way of the gate 38, to the result obtained one bit cell earlier and appearing on the output of the bit delay unit 37. The output signal of the gate 38 is applied to the bit delay unit 39. The gates 26–28 form the function $A \oplus C \oplus E \oplus G$ which is added modulo-2, by way of the gate 40, to the result obtained one bit cell earlier and appearing on the output of the bit delay unit 39. The output signal of the gate 40 is applied to the output 18 and constitutes the already described second error correction bit. The gates 19–25 form the function $A \oplus B \oplus C \oplus D \oplus E \oplus F \oplus G \oplus H$. The output signal of the gate 25 is applied to the output 17 and forms the already described first error correction bit.

Figure 6:
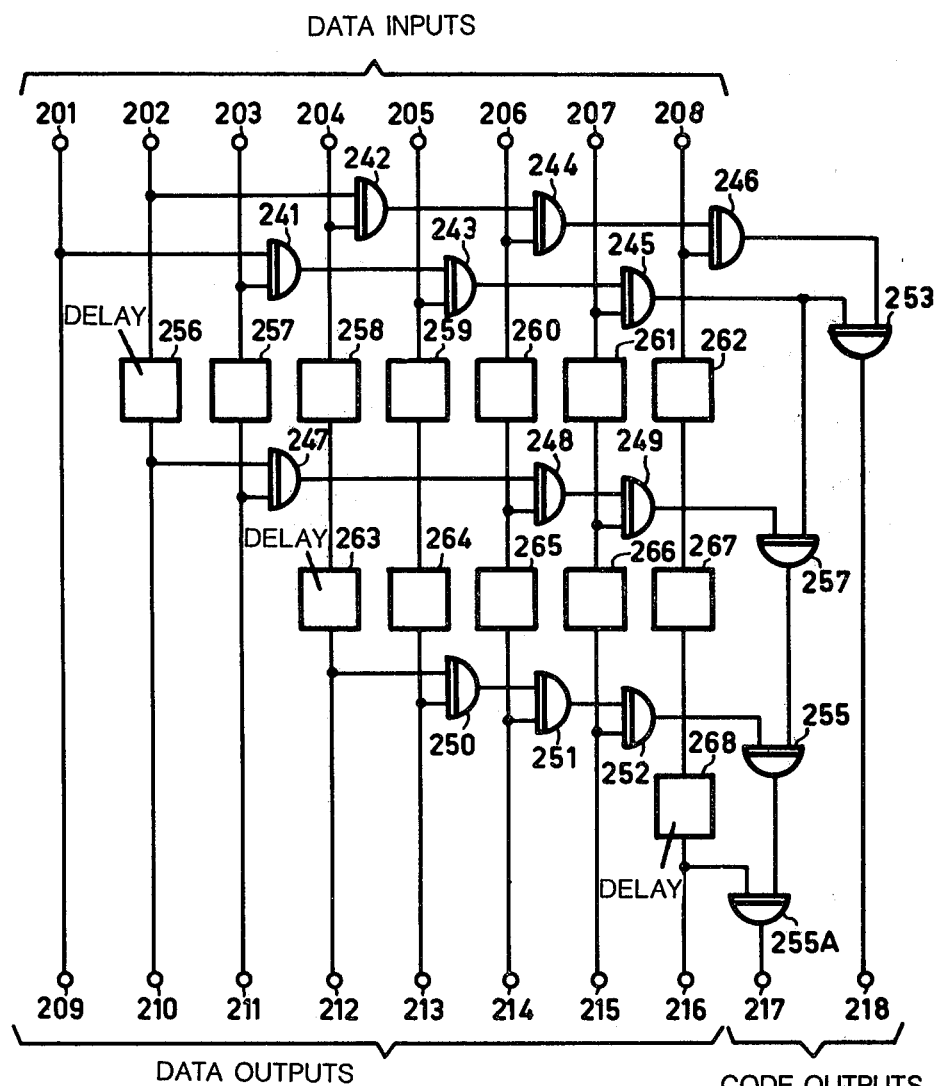
FIG. 6 shows a second coding device relating to FIG. 1.

FIG. 6 shows a different embodiment of a coding device, utilizing the same code as FIG. 4 and comprising eight inputs for data bits 201–208, eight outputs for data bits 209–216, two outputs for error correction bits 217, 218, thirteen bit delay units 256–268, and sixteen exclusive-OR-gates 241–255, 255A. In this case, the gates 241, 243, 245 form the function $A \oplus C \oplus E \oplus C$, while the gates 242, 244, 246 form the function $B \oplus D \oplus F \oplus H$, so that the gate 253 forms the parity bit $A \oplus B \oplus C \oplus D \oplus E \oplus F \oplus G \oplus H$. The gates 247, 248, 249 form the function $B \oplus C \oplus F \oplus G$ of the bit data bits arriving one bit period earlier. The gates 250, 251, 252 form the function $D \oplus E \oplus F \oplus G$ of the data bits arriving one bit period earlier yet. The three gates 254, 255, 255A form the exclusive-OR-function of the former, and the two latter functions, together with the data bit H arriving one bit period earlier yet, so that the gate 255A each time supplies the second error correction bits. This implementation is attractive notably when there is sufficient storage capacity already, for example, when these bit delay units form part of the last stages of a (two-dimensional) buffer shift register. The exclusive-OR-gates, being shown in groups of three in this figure, may also be formed like the four-bit parity determining units according to the U.S. Pat. No. 3,838,393 issued Sept. 24, 1974 to Signetics Corporation. Furthermore, in the circuit shown in FIG. 5, a number of, for example, four exclusive-OR-gates can be saved by suitable combination, for example, by the omission of the gates 21, 22, 23, 24 and combination of the signal of the gates 34 and 20 in an additional gate in order to feed the free input of the gate 25.

Figure 7:
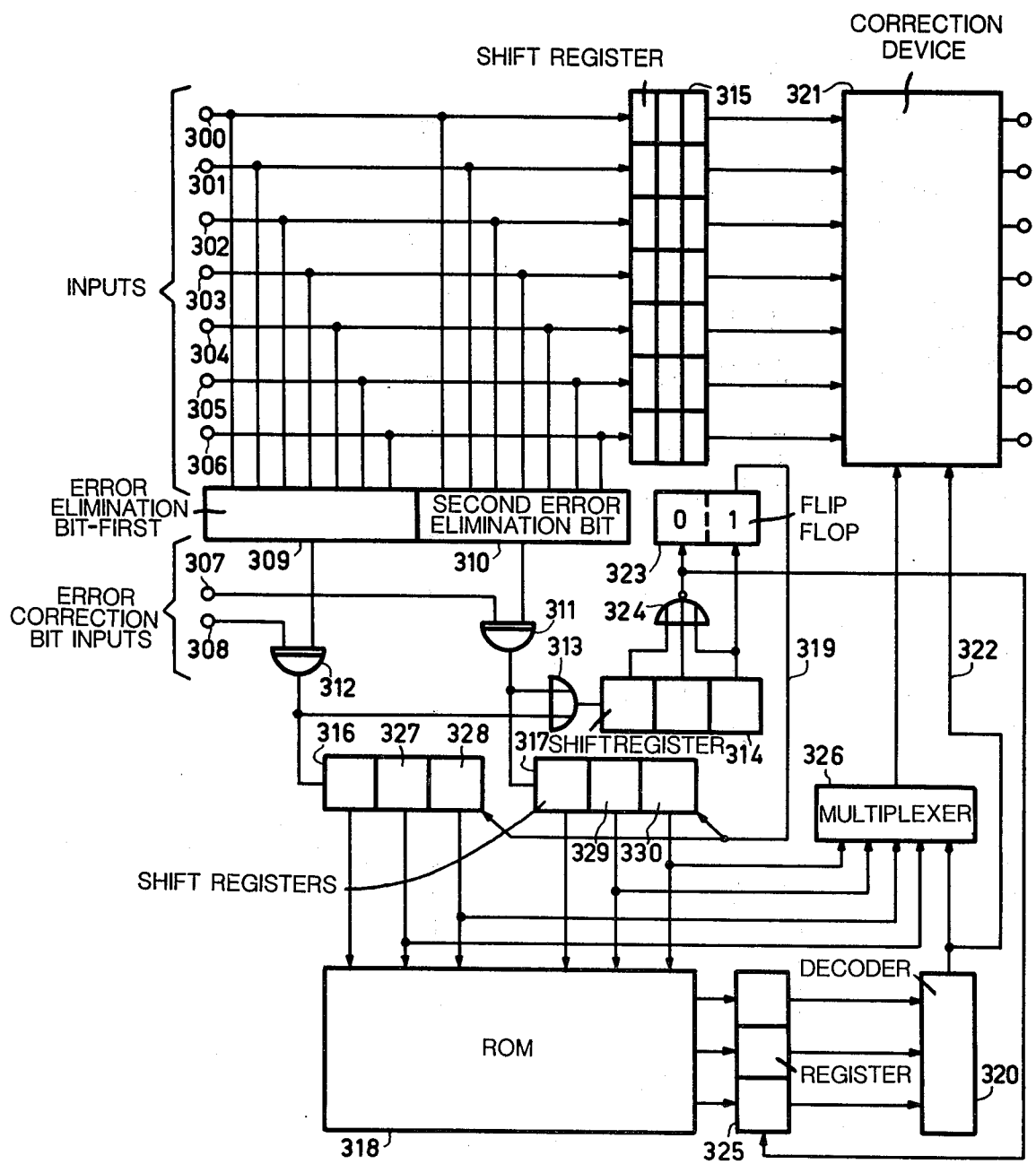
FIG. 7 shows a correction device relating to FIG. 4.

FIG. 7 shows a correction device for use with the code of FIG. 4. The coding diagram which is shown at the left in FIG. 4 comprises the column X which relate to the instantaneous data bits, and the column Y which relates to the bits having arrived one bit cell earlier. The right half of the figure shows the results occurring for the combinations of errors 100, 110, 101, 111 stated thereabove, the left bit of this group of three, each time having the value "1", also being supplied first as the error detection bit by the exclusive-OR gates 311, 312 ("1" signifies an error in the relevant data). Furthermore, in this example only the first seven lines of FIG. 4 are used: those are the inputs 300–306. The sixth and the seventh line of FIG. 4 are used for the two error correction bits. The elements 309, 310 form the first and the second error elimination bit, respectively, for example, in accordance with the principle of FIG. 5 or 6. The inputs 307 and 308 receive the first and the second error correction bit, respectively. The exclusive-OR gates 311, 312 thus form the first and the second error detection bit, respectively, which are combined in the OR-gate 313 and which are stored in the three-bit shift register 314. The same takes place as regards the data bits in the shift register 315 with a depth of three bits and a width of seven bits. The signals of the exclusive-OR-gates 311, 312 are furthermore stored in the serially loadable shift registers 316 and 317 which both have a capacity of three bits and which further operate as a six-bit address register for the read only memory (ROM) 318. The address decoder is not shown for the sake of simplicity. If at least one of the exclusive-OR-gates 311, 312 supplies a "1", after having supplied only zeroes for some time, an error in one of the input channels 300–308 is indicated. If the first "1" then appears on the output of the shift register 314, the shift registers 316 and 317 contain sufficient data for unambiguous indication of the error channel, i.e. one of the 36 addresses from the right part of FIG. 4. The "1" output signal of the shift register 314 sets the set-reset flip-flop 323 to the "1" position, the 0-1-transition transition signal from the output thereof acting, via the line 319, as an enable signal for the arrangement of the elements 316, 317, 318. At least the 28 memory locations in the ROM 318 which can thus be addressed (by the first seven lines of FIG. 4) contain the associated address of the data channel contaning an error, for example, as a three-bit code having the value range 1–7; the capacity is then 64 words of three bits each. The word locations not used may contain the data (000), because they may not control data correction any way. The word read is stored in the three-bit register 325 and is decoded, in the decoder 320, in order to form a one-out-of-seven code so as to indicate the data channel containing an error. If three successive bit cells do not produce an error, the NOR-gate 324 supplies, under the control of the three ones in the shift register 314, a logic "1" which sets the set-reset flipflop 323 and the register 325 to the zero position.

The output signal of the decoder 320 is applied, via the line 322, to the correction device 321 in order to indicate the correct channel. The output signal of the decoder 320 is also applied to the multiplexer 326 which also receives the data from the shift register stages 327, 328, 329, 330 which contain the error detection bits generated in the relevant bit cell and also those of the directly preceding bit cell: one of these four bits is conducted in order to correct the error pattern. If the input channel 300, 301 or 302 contains an error, the first error detection bit (for which the bits denoted by a cross in FIG. 4 are used) is conducted in the stage 330 to the correction device. This is because this bit then indicates the error pattern. If the input channel 303 or 304 contains an error, the first error detection bit in the stage 329 is conducted to the correction device 321: in that case the network for determining the error elimination bits incorporates an additional delay of one bit cell which is corrected by this shift. If the channel 305 contains an error, the second error detection bit (shaded in FIG. 4) is conducted in the stage 328 in a corresponding manner. If the channel 306 contains an error, the second error elimination bit is similarly conducted in the stage 327. For the channels 300, 301 and 303 use can also be made of the second error detection bit. The output signal of the multiplexer 326 forms the correction pattern for the correction device via the line 327. The multiplexer 326 has a conventional construction and will not be elaborated herein. In given cases it is advantageous to combine the devices 321 and 326 in given elements. If the output line of the (de)multiplexer is separate for each channel, the line 322 may even be omitted, while in that case the correct output line of the multiplexer 326 is directly combined with the correct data channel. The last two lines of FIG. 4 may possibly be used for two additional data channels, but in that case the two error correction channels may not contain an error. If an arbitrary error pattern occurs in a single channel, the device described operates satisfactorily. This is also applicable if errors in different channels are separated by three columns not containing an error, because in that case a 0-0-1 pattern is formed which is correctly corrected. Therefore, ether addresses (except for the address 0) may contain a warning indication which signals that an irreparable mutilation has occurred. The synchronization of shift register stages and memory (318) by a clock pulse system has been omitted in the foregoing for the sake of brevity.

Figure 8:
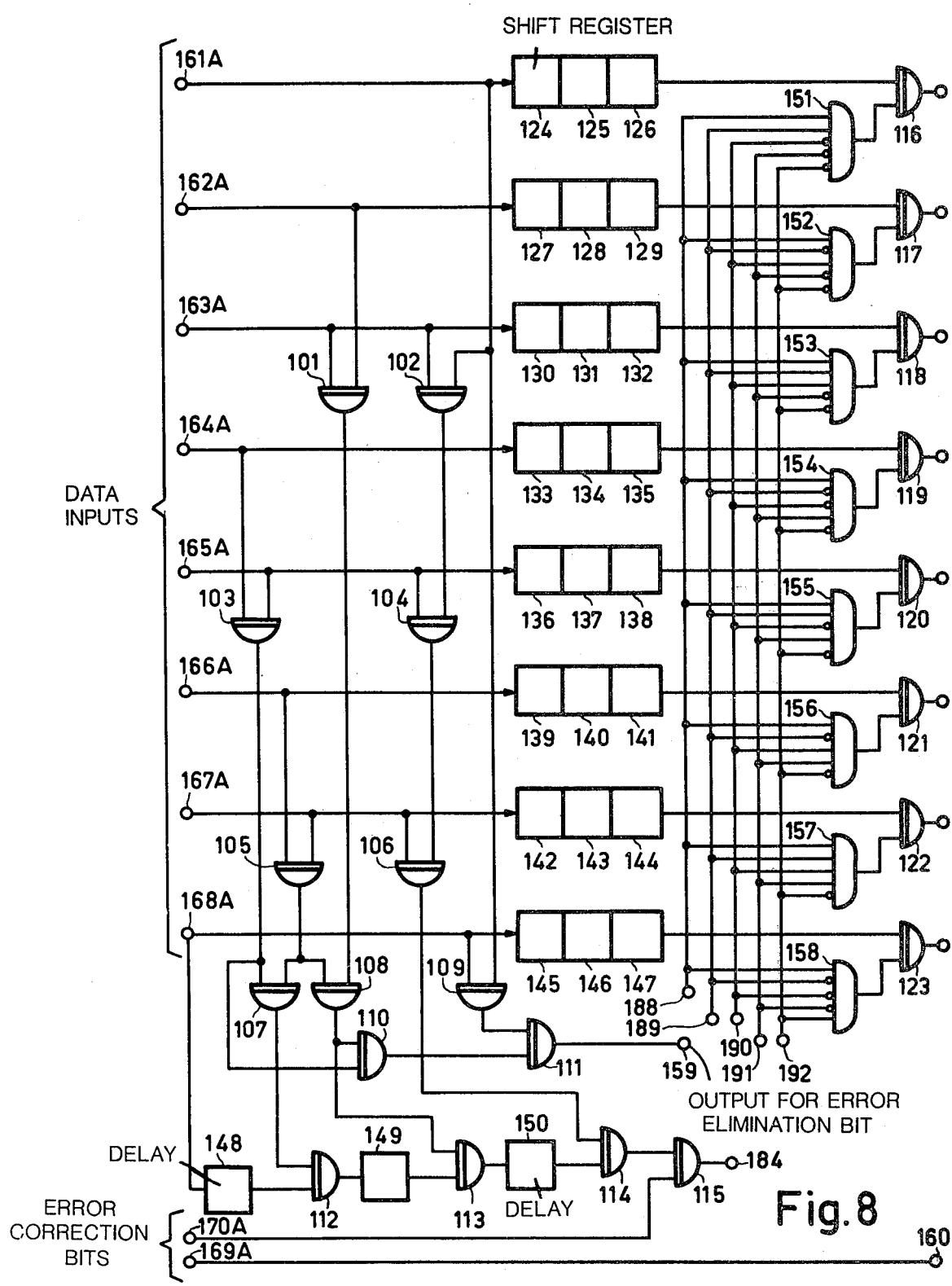
FIG. 8 shows a first part of a more detailed correction device as a pendant of FIG. 5.

FIG. 8 shows a first part of a decoding/correction device, based on the organization of the FIGS. 1, 5 and 6. The data bits appear on the channels 161 A–168 A in the sequence A to H. The first error correction bit appears on the channel 169A; the second error correction bit appears on the channel 170A. The device first of all contains a matrix of coefficients which corresponds to FIG. 5 and which contains the exclusive-OR-gates 101–114 and three bit delay units 148, 149, 150. The latter are formed by shift register stages and are driven by a single clock pulse system having a frequency equal to the bit frequency. This clock pulse system also drives the further parts of the circuit, as will be described hereinafter. For example, the gate 111 generates the first error elimination bit on its output and the gate 114 generates the second error elimination bit on its output. These bits are thus each time generated in a bit flow related to the data bits, the system starting, for example, by despatching a series of zeroes on all ten channels. Because the generating of elimination/test bits is realized in accordance with the same algorithms, the relevant devices can also be used into two directions, for example, in the case of semiduplex traffic. Secondly, the device comprises for each data channel (inputs 161 A–168 A) a three-bit shift register which is also activated (in a manner not shown) by a clock pulse during each bit period (elements 124–147). The length of these shift registers is one stage less than the number corresponding to the longest pattern in FIG. 1, which comprises four successive bit cells (channel H with respect to the shaded column). The purpose of this storage will be described hereinafter.

Figure 9:
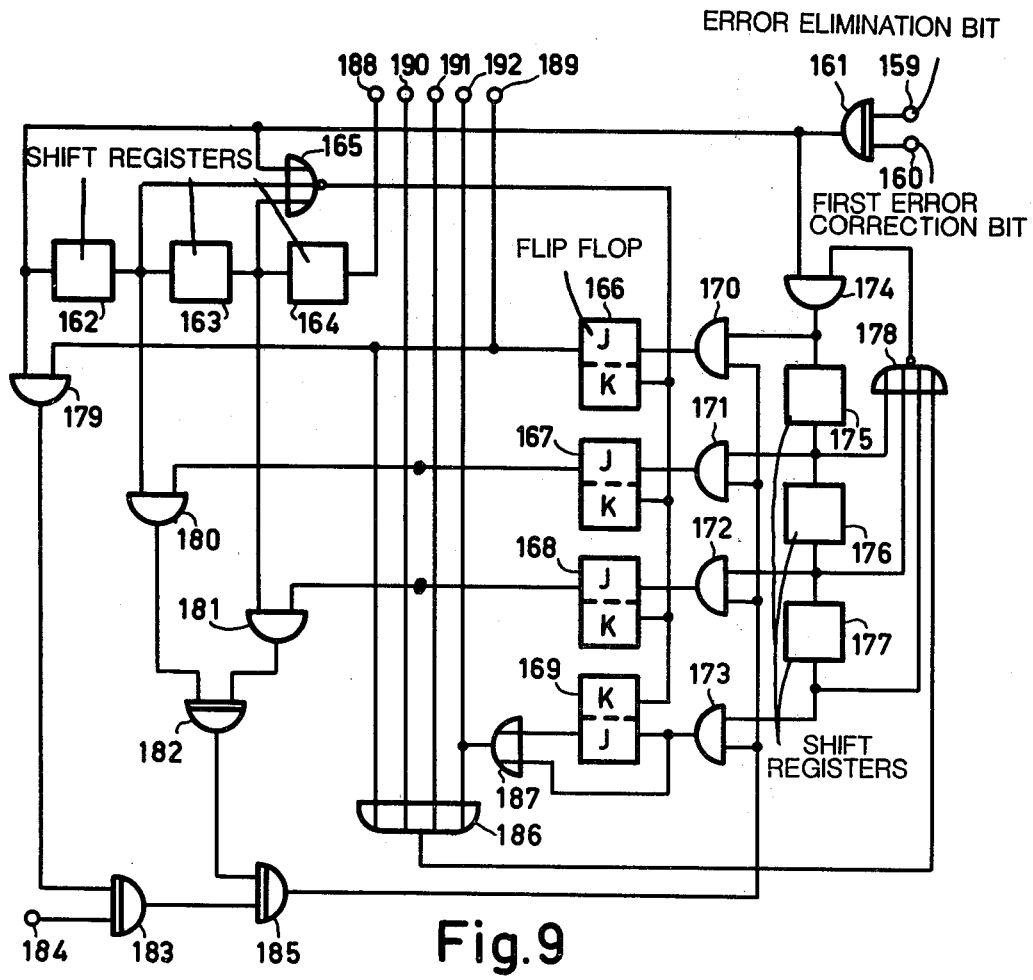
FIG. 9 shows the remainder of a coding device relating to FIG. 8.

In this respect, reference is made to FIG. 9 which show a second part of the decoding device which is partly shown in FIG. 8. The first error elimination bit appears on the terminal 159 and is added modulo-2 to the first error correction bit on the terminal 160 in the exclusive-OR gate 161. A resultant logic "1" indicates that at least one error has occurred (or another odd number of errors, but this will not be elaborated herein) in the relevant data. If the result is a logic "0", the relevant group of eight bits does not contain an error (or 2, 4 . . . errors have occurred, but this will not be elaborated either). Contrary to the foregoing, the effect of two or more successive bit errors may be encountered during the determination of a possible discrepancy between second error correction bit and second error elimination bit. The second error elimination bit of the gate 114 is added modulo-2, in the exclusive-OR-gate 115, to the second error correction bit on the channel 170A. The appearance of a logic "0" on the output 184 may then signify that:

(a) no error has occurred in the crossed bit cells in the eight channels of FIG. 1.

(b) two errors have occurred in the relevant thirteen bit cells. This case will be further elaborated.

However, if a logic "1"0 appears on the output 184, it may be that a single bit error has occurred in the thirteen crossed bit cells in FIG. 1. If this concerns the channels A, B, D or H, an exact correspondence exists with one logic "1" signal of gate 161 whereby the error is localized, i.e. by the difference in the number of bit cells between the appearance of said discrepancies resulting in a "1" on the exclusive-OR-gate (115 or 161). If the next bit is incorrect again in these three channels, a sequence occurs where both gates 115, 161 supply a row of "1" signals having the same length as a number of bits to be corrected.

If the indicated single incorrect bit concerned the channel C, E or F, the localization is determined by one signal "1" from gate 160 and two logic "1" signals from gate 115 if an isolated error is concerned. If, for example, a series of successive bit cells is incorrect in the channel C or F, a "1" signal appears on the output 184 only at the beginning and at the end of this series (length one bit cell larger than the series of errors), while the signal from the gate 161 indicates a column with an error. In the channel E, odd and even bit cells, belong to different sets, but for the remainder the same is valid as for the channel C or D. Also in these cases it is again applicable that the localisation is determined by the difference (in bit cells) between the first signalling on the gate 161 and the first or the second signalling on the gate 115, respectively. A series of successive bit errors in this channel will cause two successive "1" signals on the output 184, at the beginning as well as at the end of the series of errors, while the intermediate range produces "0" signals on the terminal 184. The series of the terminal 184 is then two bit cells longer than the series of incorrect data bits. If the indicated single error concerns the channel G, the localization is determined by one signal "1" from gate 161 and three successive "1" signals from the gate 115 if an isolated error is concerned. A series of errors produces a series of signals 10100101 on the output 184 having an overall length which is two bit cells longer than the error series. The foregoing is merely an example of an error pattern; it follows from an analysis that all patterns of a single channel error can be corrected. Multi-channel errors, generally, are irreparable. In this embodiment, multichannel errors generally are configurations where errors occur in two different channels without at least three (in this arrangement) columns of data bits without errors occurring between the appearance of errors in different channels. Thus, this number is one smaller than the number of columns taken into account for determining the second error correction bits.

It is thus possible for two bit errors to occur simultaneously, so that a given "0" indication of the gate 115 still indicates an error condition. The signals from the terminal 184 are also applied to the exclusive-OR gate 183. The signals from the gate 161 are stored in a three-bit shift register which comprises the stages 162, 163, 164 and which is activated by the previously described clock pulses. If three successive signals from the gate 161 have the value "0", the NOR-gate 165 applies a logic "1" to the JK-flipflops 166, 167, 168, 169. These are flipflops which react to the edge of the clock pulses (edge triggered flipflops), said clock pulses being the same as previously stated; the clock pulse lines have been omitted for the sake of simplicity. These flipflops are, for example, of the type TI.74S76 and have the following truth table:

| J | K | $c_i$ |
|---|---|---|
| 0 | 0 | $c_i-1$ |
| 0 | 1 | 0 |
| 1 | 0 | 1 |
| 1 | 1 | $\overline{c_i-1}$ |

For $J=K=0$, nothing happens; for $J=K=1$, the position always changes when a clock pulse is received. The clock pulses may be recovered from the data flow itself, for example, by means of a device as described in British Patent No. 1346547. The clock pulses then appear at the boundaries between the bit cells; known steps, for example, suitable delays in the logic elements, are taken to ensure that none of the known "race" conditions arises. When three correct bit columns (FIG. 1) have been received, the logic gate 165 supplies a logic 1, which means that $K=1$ for the flipflops 166-169. If, furthermore, the shift register stages 175, 176, 177 contain a logic "0" and the gate 161 supplies a logic "0" (the latter is necessary to ensure that the gate 165 supplies a logic "1"), $J=0$ for the flipflops 166-169 and these flipflops in any case assume the "0" position which acts as the rest position. The output signals of the flipflops 166-169 are applied to the terminals 189, 190, 191, 192 which are connected to the circuit shown in FIG. 8. In this circuit, the AND/NAND gates 151-158 form, by way of their inputs which are inverting or not and which are denoted by a circle, a decoder which is capable of decoding the binary code to a 1-out-8 code. If all flipflops 166-169 output a zero, none of these gates, however, can conduct the signal on the terminal 188. In the present situation, being a "rest" situation, the OR-gate 186 supplies a logic "0", with the result that the NOR-gate 178 is unblocked. If the shift register stages 175, 176, 177 also contain a logic "0", the NOR-gate 178 supplies a logic "1", with the result that the AND-gate 174 is unblocked. The output signals of the gate 174 are stored in the three-bit shift register comprising the stages 175, 176, 177 which receives, in the same manner as described previously for the shift registers, a shift pulse from the clock along a connection not shown. However, if one of these three stages contains a logic "1", the AND-gate 174 is blocked thereby.

Assuming the described rest situation, an error can be indicated by a logic "1" on the output of the gate 161. If the gate 115 supplies a logic "0", one of the channels B, D, F or H is concerned. In reaction to the next clock pulse, the "1" from the gate 161 is stored in the shift register stages 162 and 175, with the result that the gates 165 and 178, 174 supply a logic "0" for the time being. The delay in the shift register stage 175 plus the gates 178, 174 is sufficient to ensure that the storage in the gate 175 can be realised without the so-termed "race conditions". If the gate 115 supplies a logic "1" in the above case, the gate 170 receives two "1"-signals: $J=1$, $K=0$ and the flipflop 116 assumes the "1" position; thus, this concerns an error in one of the channels A, C, E or G.

If the error concerns the channel A, the state of the flipflops 166-169 remains the same; the gate 179 can conduct and the gates 115, 161 each time supply the same signal, so that the AND-gates 170-173 do not again receive two logic "1" signals. Thus, the gate 151 of FIG. 8 can conduct the signal on the terminal 188, so that after three bit cells the signal from the shift register stage 164 activates, via the gate 151 and the exclusive-OR-gate 116, the signal of the channel A in the case of a detected error.

If the error concerns the channel B, the signal "1" on the terminal 184 appears one bit cell later than the signal from the gate 161, so that the latter is then stored in the shift register stage 175. Regardless of further errors, the gate 170 is then blocked, so that the "1" on the terminal 184 is taken up in the position of the flipflop 167 via the gate 171. Subsequently, the state is stable, because a logic "1" on the terminal 184 always appears simultaneously with a "1" signal on the output of the shift register stage 162 which has been supplied by the gate 161 in the previous bit cell. As a result, the exclusive-OR-gate 185 continuously supplies a zero signal. Similarly as described for the channel A, the gate 152 can then conduct in order to activate a correction for the channel B via the exclusive-OR-gate 117.

The procedure for an error in the channel D is the same, be it that the first "1" on the terminal 184 appears two bit cells after "1" from the gate 161; the latter is then stored in the shift register stages 163, 176: in that case only the flipflop 168 assumes the "1" position.

In the case of an error in the channel H, the signal from the terminal 184 is used directly: the signal from the gate 161 is then stored in the stage 177 (after three bit cells), so that the logic gate 173 supplies a logic "1": $J=1$ for the flipflop 169. In that case, K is arbitrary, but the output signal of the flipflop 169 becomes "1" in any case. The output signal of the gate 173 is then directly used to enable the gate 158 to conduct; otherwise an additional shift register stage would be required in all channels. After the setting of the flipflop 169, the output signal thereof is active in the same way via the OR-gate 187.

In the case of an error in the channel C, the flipflop 166 is set to the "1" position in the described manner and the "1" from the gate 161 is shifted to the stage 175 and also to the stage 162. If no error occurs in the second bit column, the gate 161, and hence also the gate 179, supplies a zero. The terminal 184, however, then receives a "1", with the result that the flipflop 167 also assumes the "1" position. If the second bit column does contain an error, the gate 161 supplies a "1", like the gate 179. In that case the signal on the terminal 184 is determined by two errors and equals zero. Thus, the flipflop 167 again assumes the "1" position. Subsequently, nothing further changes, because either none or two of the signals from the gates 115, 179 and 180 produce a logic "1" signal.

In the case of an error in the channel F, the procedure is the same, be it that there is an additional time shift of one bit cell between the signals from the gates 115 and 161, so that the flipflops 167 and 168 assume the "1" position.

In the case of an error in the channel E, the flipflop 166 assumes the "1" position. If the next column contains an error, the gates 161 and 179 supply a "1" signal. However, the gate 115 also supplies a "1", so that the gate 183 supplies a zero. If this column (the second) does not contain an error, the gates 115 and 161 supply a zero. If the third column does not contain an error, the gate 161 supplies a zero. However, the gate 115 then supplies a "1" due to the error in the first column, so that the flipflop 168 assumes the "1" position. If the third column does contain an error, the gate 161 supplies a "1", but two one-bit errors are then taken into account for the gate 115, so that the terminal 184 remains zero. The flipflop 168 then again assumes the "1" position.

In the case of an error in the channel G, the flipflops 166, 167 assume the "1" position as described for channel C. The following possibilities then exist: column errors:

|   |   |   |   | 184 | 179 | 180 | 185 |
|---|---|---|---|-----|-----|-----|-----|
| 1 | 2 | 3 |   | 1   | 1   | 1   | 1   |
| 1 | 2 |   |   | 0   | 0   | 1   | 1   |
| 1 |   | 3 |   | 0   | 1   | 0   | 1   |
| 1 |   |   |   | 1   | 0   | 0   | 1   |

In all cases, the flipflop 168 also assumes the "1" position. Some possibilities are then:

|   |   |   |   | 184 | 179 | 180 | 181 | 185 |
|---|---|---|---|-----|-----|-----|-----|-----|
| 1 | 2 | 3 | 4 | 1   | 1   | 1   | 1   | 0   |
| 1 | 2 |   | 4 | 0   | 1   | 0   | 1   | 0   |
| 1 |   | 3 | 4 | 0   | 1   | 1   | 0   | 0   |
| 1 |   |   | 4 | 1   | 1   | 0   | 0   | 0   |

Figure 10:
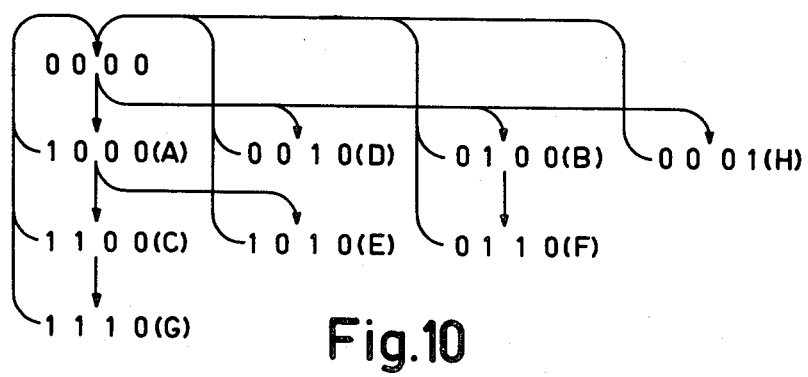
FIG. 10 shows a status diagram of the storage device shown in FIG. 9.

Thus, the status formed is always maintained, while the right channel is corrected by the decoding in the gates 151-158. In this respect, FIG. 10 shows a diagram of the position which can be assumed by the flipflops 166-169; the flipflop 166 concerns the extreme left bit. The arrows indicate the possible transitions. If the relevant position is an end position, an error in the data channels stated therebehind is concerned. The position 0000, being the rest position, can be reached directly from all other positions.

The diagram of FIG. 1 can be implemented in a corresponding manner for a different number of channels. This is also applicable to the diagram of FIG. 2. The differences on the one hand concern the construction of the matrix of coefficients implemented by the gates 101-115 c.s. in FIG. 8, and on the other hand the decoding in the gates 151-158. Furthermore, the number of flipflops 166-169 is applicable to only 8 to 15 channels for FIG. 1, and only to 7 to 10 channels for FIG. 2. For the diagram of FIG. 3, hold elements are required for determining all error correction/elimination bits.

Thus, the circuit in accordance with the FIG. 6, 7 comprises the following components:

(1) the matrix of coefficients for calculating the first and the second error elimination bit and for determining any discrepancy with respect to the corresponding first and the second error correction bit (elements 101-115, 148, 149, 150, 161).

(2) delay lines for data elements and the discrepancy signal of first error correction/elimination bits, having a length equal to the longest time sequence pattern or the highest power of the delay operator D in the polynomial used for the second correction bits, or one bit shorter (elements 124-147, 162-164).

(3) a sequencer device, comprising a start input and a stop input for adjusting the code of the channel containing an error (elements 174-178).

(4) a device for determining the take over signal T in accordance with the formula $T = R \oplus Q0.G0 \oplus Q1.G1 \oplus \ldots Q(n-1) G(n-1)$, in which R is the discrepancy between the correctly generated second error elimination bit/second error correction bit, Qj the discrepancies between successive first error correction bits/first error elimination bits, and Gj the already stored elements of the correction vector (elements 179-185).

(5) a demultiplexer which can be activated by the take over signal T for conducting one bit of the position of the control device (elements 170-173).

(6) a storage element for storing the correction vector (elements 166-169, 186, 187).

(7) a decoding device/demultiplexing device for conducting the delayed discrepancy signal between first error correction/elimination bits to a single one of the data channels for correction (elements 116-123, 151-158).

What is claimed is:

1. A device for introducing binary data into a medium, said device comprising:

parallel data inputs for receiving streams of input data bits in successive first groups of $(n-2)$ bits each, said successive groups being interspaced in time over a delay cell D;

$(n-2)$ parallel data outputs, wherein n is $>6$, for presenting said first groups of $(n-2)$ data bits each in order of reception to $(n<2)$ respective parallel data channels of the medium;

said data outputs being connected to said data inputs; means connected to said data inputs with modulo 2 adding means for receiving the data content of a first group of $(n-2)$ data bits received and therefrom producing synchronously with each presentation of said group to said $(n-2)$ parallel data channels, a first error correction bit to an $(n-1)$th parallel redundancy channel of said medium, wherein for each of said at least $(n-2)$ data channels the contribution to the first error correction bit is expressed in a respective first non-zero polynomial in the delay cell operator D;

Second means connected to said input means with second modulo-2 adding means and delay means for receiving the data content of a second group of at least $(n-1)$ data bits received on said data input and producing therefrom by said second modulo-2 adding means and delay means synchronously with each presentation of said first group to said $(n-2)$ parallel data channels a second error correction bit to an nth parallel redundancy channel of said medium;

wherein for each of said $(n-2)$ data channels a second subgroup of at least one bit forms part of a third group as expressed by a respective second non-zero polynomial in the delay cell operator D;

wherein for single channel error correction the quotient of the second polynomial in the delay cell operator D of a channel contributing to the second error correction bits and the corresponding first polynomial in the delay cell operator D is different from all said quotients associated to other channels;

wherein for at least substantially half of the channels contributing to the second error correction bits the associated second polynomial has at least two terms while the total delay incurred in the generation of said second error correction bits is at most substantially equal to half the number of bit cells as the number of channels contributing to the second error correction bits.

2. A device as claimed in claim 1, characterized in that said first sub-groups contain exactly one data bit for each of the data channels.

3. A device as claimed in claim 2, characterized in that the data bits of a second group are introduced simultaneously into the medium.

4. A device as claimed in claim 1, in which said second group contains a single first data bit for each of the data channels, characterized in that the coefficients of the polynomials in the delay operator D of the second sub-groups which are used for a single second error correction bit among themselves form a binary code.

5. A device as claimed in claim 4, characterized in that the maximum length of said binary code in bit cells at the most equals the smallest integer number P which at least equals $^2\log(n-1)$.

6. A device as claimed in claim 1, werein said second and third groups contain at least one bit pertaining to each of the (n−1) other channels.

7. A device for extracting and, if necessary, correcting binary data received from a medium in n parallel presented channels, including first and second error correction channel as claimed in claim 1, characterized in that there is provided a recalculation device (309, 310, 311, 312) for calculating a first and a second error elimination bit from fourth and fifth groups of data bits, respectively, which correspond to said second and third groups, respectively, and also for calculating first error correction bits (Q) by modulo-2 addition of corresponding first error correction bits and first error elimination bits and second error correction bits (R) by modulo-2 addition of corresponding second error correction bits and second error elimination bits, said error detection bits having a correspondence value (0) or a discrepancy value (1); a detection device (313, 314, 323, 324) connected to an output of the recalculation device for detecting within a predetermined length sequence of error detection bits at least one discrepancy value and thereupon generating a storage control signal (319), but upon absence of such detection generating a reset signal; a storage device (316, 317, 327, 328, 329, 330) for storing a second sequence of error detection bits; a vector decoding device (318) connected to said storage device for, upon said storage control signal decoding the contents of said storage device to a channel vector data, presentation to a second storage device (325), said second storage device being also connected to an output of said detection device for, upon said reset signal, storing a dummy channel vector data; and a correction device (321) connected to said first and second storage devices for correcting a bit position indicated by an error detection bit from a channel indicated by said channel vector data.

8. A device as claimed in claim 7, further including a shift register and characterized in that an output of said detection device is connected to an input of said shift register which is activated for each bit cell in order to store therein, under the control of a first received error detection bit having the discrepancy value, a running 1-out-of-p code, outputs of said shift register being connected to inputs of the storage device in order to apply thereto, under the control of further discrepancy signals, elements of the correction vector up to a maximum length of p binary elements.

* * * * *

UNITED STATES PATENT AND TRADEMARK OFFICE
CERTIFICATE OF CORRECTION

PATENT NO. : 4,395,768
DATED : July 26, 1983
INVENTOR(S) : JEAN M.E.B. GOETHALS ET AL It is certified that error appears in the above-identified patent and that said Letters Patent is hereby corrected as shown below:

Claim 1, column 14, line 59 change "(n-1)" to --(n-2)--

Signed and Sealed this

*Twenty-sixth* Day of *March 1985*

[SEAL]

*Attest:*

DONALD J. QUIGG

*Attesting Officer*     *Acting Commissioner of Patents and Trademarks*